(12) United States Patent
Rider et al.

(10) Patent No.: US 12,035,507 B2
(45) Date of Patent: Jul. 9, 2024

(54) TECHNOLOGIES FOR DYNAMIC COOLING IN A MULTI-CHIP PACKAGE WITH PROGRAMMABLE IMPINGEMENT VALVES

(71) Applicant: Intel Corporation, Santa Clara, CA (US)

(72) Inventors: Scott Rider, Beaverton, OR (US); Devdatta Kulkarni, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/723,099

(22) Filed: Apr. 18, 2022

(65) Prior Publication Data
US 2022/0240417 A1 Jul. 28, 2022

Related U.S. Application Data

(63) Continuation of application No. 16/924,789, filed on Jul. 9, 2020, now abandoned.

(51) Int. Cl.
*H05K 7/20* (2006.01)
*H01L 23/24* (2006.01)
(Continued)

(52) U.S. Cl.
CPC ......... *H05K 7/20254* (2013.01); *H01L 23/34* (2013.01); *H01L 25/065* (2013.01)

(58) Field of Classification Search
CPC ..... H05K 7/20254; G06F 1/206; H01L 23/34; H01L 25/065
(Continued)

(56) References Cited

U.S. PATENT DOCUMENTS

| 3,993,123 A | 11/1976 | Chu et al. |
| 4,138,692 A * | 2/1979 | Meeker ............... H01L 23/4332 257/E23.091 |

(Continued)

FOREIGN PATENT DOCUMENTS

| GB | 2576032 B | 4/2021 |
| GB | 2576030 B | 12/2021 |

(Continued)

OTHER PUBLICATIONS

Ellsworth, Jr., Michael J, "Thermal Analysis for MMIC and RF PCB Power Applications," High Powered Chip Cooling, Air and Beyond, Electronics Cooling, Aug. 1, 2005, 10 pages.

(Continued)

*Primary Examiner* — Anatoly Vortman
(74) *Attorney, Agent, or Firm* — Hanley, Flight & Zimmerman, LLC (57) ABSTRACT

Technologies for dynamic cooling include a computing device having a multi-chip package including multiple dies and a cold plate coupled to the multi-chip package. Micro nozzle valves are coupled to fluid passage zones of the cold plate positioned adjacent to the dies, and are configured to control fluid flow into the fluid passage zones. The computing device reads a predetermined die junction temperature for each die, determines a current die junction temperature for each die, compares the predetermined die junction temperature to the current die junction temperature for each die, and determines a fluid flow rate for each die based on that comparison. The computing device controls the micro nozzle valves adjacent to each die based on the respective fluid flow rate. The dies may include processor cores, field-programmable gate arrays, memory devices, or other computer chips. Other embodiments are described and claimed.

27 Claims, 7 Drawing Sheets

(51) Int. Cl.
  *H01L 23/34* (2006.01)
  *H01L 25/065* (2023.01)
(58) Field of Classification Search
  USPC ........................................................ 361/702
  See application file for complete search history.

(56) References Cited

U.S. PATENT DOCUMENTS

| | | | |
|---|---|---|---|
| 4,153,107 A | 5/1979 | Antonetti et al. | |
| 4,156,458 A | 5/1979 | Chu et al. | |
| 4,203,129 A * | 5/1980 | Oktay | H01L 23/473 |
| | | | 174/16.3 |
| 4,226,281 A | 10/1980 | Chu | |
| 4,649,990 A | 3/1987 | Kurihara et al. | |
| 4,765,400 A | 8/1988 | Chu et al. | |
| 4,928,207 A * | 5/1990 | Chrysler | H01L 23/427 |
| | | | 257/E23.093 |
| 5,023,695 A | 6/1991 | Umezawa et al. | |
| 5,083,373 A | 1/1992 | Hamburgen | |
| 5,097,385 A * | 3/1992 | Chao-Fan Chu | H01L 23/445 |
| | | | 174/16.3 |
| 5,285,351 A * | 2/1994 | Ikeda | H01L 23/433 |
| | | | 257/E23.09 |
| 5,349,831 A * | 9/1994 | Daikoku | H01L 23/427 |
| | | | 165/80.4 |
| 6,351,384 B1 | 2/2002 | Daikoku et al. | |
| 7,000,684 B2 | 2/2006 | Kenny et al. | |
| 7,435,623 B2 | 10/2008 | Chrysler et al. | |
| 9,165,857 B2 | 10/2015 | Song et al. | |
| 9,686,888 B2 | 6/2017 | Song et al. | |
| 9,852,963 B2 * | 12/2017 | Shedd | F28F 9/26 |
| 10,147,666 B1 * | 12/2018 | Trimberger | H01L 23/544 |
| 10,228,735 B2 | 3/2019 | Kulkarni et al. | |
| 10,468,331 B2 | 11/2019 | Chang et al. | |
| 10,798,851 B1 | 10/2020 | Weber | |
| 2005/0151244 A1 | 7/2005 | Chrysler et al. | |
| 2008/0002364 A1 | 1/2008 | Campbell et al. | |
| 2009/0218078 A1 | 9/2009 | Brunschwiler et al. | |
| 2009/0296511 A1 | 12/2009 | Henry et al. | |
| 2017/0257981 A1 | 9/2017 | Weber | |
| 2019/0004573 A1 | 1/2019 | Kulkarni et al. | |
| 2019/0221499 A1 | 7/2019 | Chang et al. | |
| 2019/0364691 A1 * | 11/2019 | Subrahmanyam | H05K 7/20518 |
| 2019/0385925 A1 | 12/2019 | Walczyk et al. | |
| 2021/0320050 A1 | 10/2021 | Robinson et al. | |
| 2021/0348624 A1 * | 11/2021 | Diglio | F04D 29/588 |
| 2022/0015262 A1 | 1/2022 | Rider et al. | |

FOREIGN PATENT DOCUMENTS

| | | |
|---|---|---|
| GB | 2597525 A | 2/2022 |
| GB | 2601357 A | 6/2022 |

OTHER PUBLICATIONS

Final Office Action for U.S. Appl. No. 16/924,789, Mailed Feb. 18, 2022, 11 pages.
First Office Action for U.S. Appl. No. 16/924,789, Mailed Oct. 7, 2021, 13 pages.
Insights From the Leading Edge, "IFTLE 174 DARPA ICECool Efforts for 3DIC Stack Cooling," http://iftle.blogspot.com/2014/01/iftle-174.html, posted Saturday, Jan. 4, 2014, 5 pages.
Prasher, Ravi and Chang, Je-Young, "Cooling of Electronic Chips Using Microchannel and Micro-Pin Fin Heat Exchangers," Proceedings of the Sixth International ASME Conference on Nanochannels, Microchannels and Minichannels, ICNMM 2008-62384, Jun. 23-25, 2008, Darmstadt, Germany, 7 pages.
Restriction Requirement for U.S. Appl. No. 16/924,789, Mailed Aug. 6, 2021, 8 pages.
Wei, Tiwei et al, "Conjugate Heat Transfer and Fluid Flow Modeling for Liquid Microjet Impingement Cooling with Alternating Feeding and Draining Channels," MDPI, Fluids, Published Aug. 1, 2019, 19 pages.

* cited by examiner

TECHNOLOGIES FOR DYNAMIC COOLING IN A MULTI-CHIP PACKAGE WITH PROGRAMMABLE IMPINGEMENT VALVES

CLAIM OF PRIORITY

This application is a continuation of U.S. application Ser. No. 16/924,789, filed Jul. 9, 2020, entitled "TECHNOLOGIES FOR DYNAMIC COOLING IN A MULTI-CHIP PACKAGE WITH PROGRAMMABLE IMPINGEMENT VALVES," which is incorporated in its entirety herewith.

BACKGROUND

Computer processors may be constructed using multi-chip packages (MCPs), which include multiple computer chip dies within a single physical package. Typically, all dies in an MCP are cooled using a single heat spreader/heat sink. Each die within an MCP may have different thermal properties, and platform thermal management typically prevents the worst case die from exceeding thermal limits.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Figure 1:
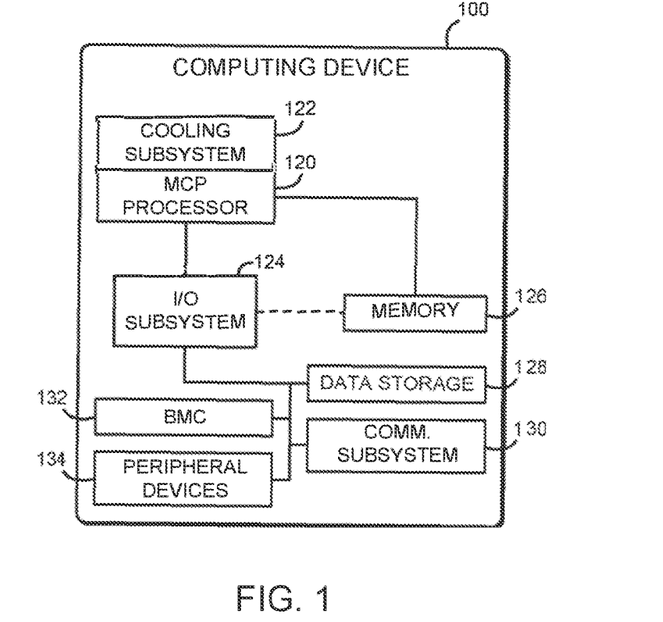
FIG. 1 is a simplified block diagram of at least one embodiment of a computing device for dynamic cooling in a multi-chip package.

Referring now to FIG. 1, an illustrative computing device 100 for dynamic cooling in a multi-chip package (MCP) is shown. In use, as described below, the computing device 100 monitors junction temperatures for all dies within the MCP and compares the current junction temperature to a die-specific optimal junction temperature. The computing device 100 controls impinging fluid flow directed at each die within the MCP by opening or closing multiple micro nozzle valves associated with each die. By controlling the fluid flow, the computing device 100 may operate each die within the MCP at or near an optimal junction temperature that is specific to that die. By operating at the optimum temperature, leakage power of each die may be reduced, and performance may be improved by allowing each die to operate at higher frequencies for longer times. Additionally, silicon yields may be improved because more parts may be able to meet power/performance targets at an optimal junction temperature as opposed to a maximum junction temperature. Further, the computing device 100 may provide fast control of cooling flow rates (e.g., on the order of milliseconds), which may improve response time for switching to turbo mode. Additionally, tuned liquid flow rates may reduce pump power requirements or otherwise improve cooling system efficiency.

Figure 8:
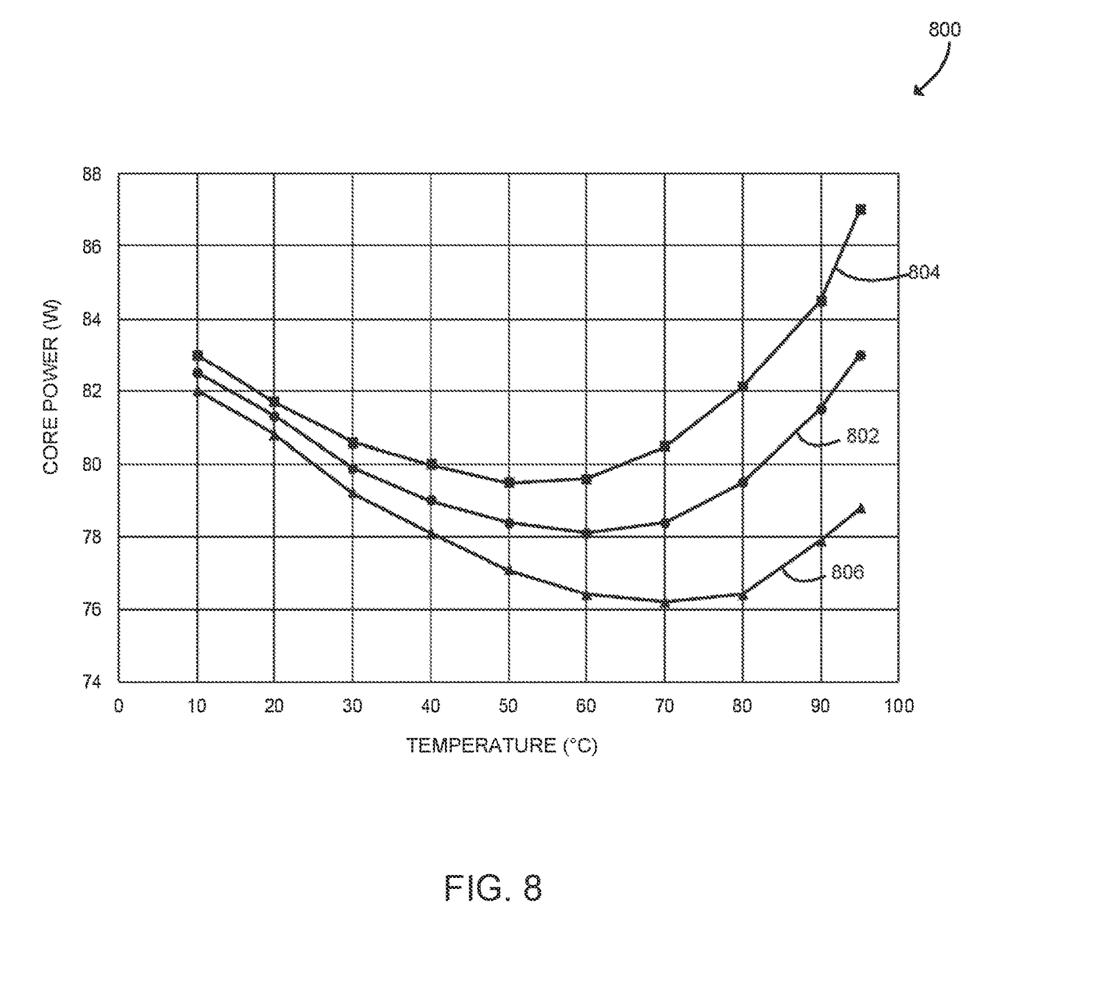
FIG. 8 is a plot illustrating core power versus temperature for multiple processor core dies.

Referring now to FIG. 8, diagram 800 illustrates core power consumed versus temperature for multiple processor core dies that are produced on the same silicon process node (e.g., 14 nm). Curve 802 represents a die exhibiting typical leakage current. As shown, power consumed increases at lower temperatures (e.g., 10° C. to 60° C.) due to dynamic power consumption (voltage must be increased to operate at low temperatures). Power consumed increases at higher temperatures (e.g., 60° C. to 95° C.) due to leakage losses. Thus, as shown, for the typical leakage die 802, power consumption is minimized at about 60° C., which may be the optimal temperature for that die. Similarly, curve 804 represents a die exhibiting high leakage current, and curve 806 represents a die exhibiting low leakage current. Each of those dies has a different optimal temperature, illustratively about 50° C. for the high leakage die and about 70° C. for the low leakage die. Similarly, dies produced with different silicon processes may have different optimal temperatures.

Referring back to FIG. 1, the computing device 100 may be embodied as any type of device capable of performing the functions described herein. For example, the computing device 100 may be embodied as, without limitation, a server, a workstation, a multiprocessor system, a computer, a laptop computer, a notebook computer, a tablet computer, a mobile computing device, a smartphone, a wearable computing device, and/or a consumer electronic device. As shown in FIG. 1, the illustrative computing device 100 includes a multi-chip package (MCP) processor 120 coupled to a cooling subsystem 122, an I/O subsystem 124, a memory 126, and a data storage device 128. Additionally, in some embodiments, one or more of the illustrative components may be incorporated in, or otherwise form a portion of, another component. For example, the memory 126, or portions thereof, may be incorporated in the MCP processor 120 in some embodiments.

The MCP processor 120 may be embodied as any type of processor capable of performing the functions described herein. For example, the MCP processor 120 may be embodied as a single or multi-core processor(s), field-programmable gate array (FPGA), digital signal processor, microcontroller, or other processor or processing/controlling circuit. Similarly, the memory 126 may be embodied as any type of volatile or non-volatile memory or data storage capable of performing the functions described herein. In operation, the memory 126 may store various data and software used during operation of the computing device 100 such operating systems, applications, programs, libraries, and drivers. The memory 126 is illustratively coupled directly to the MCP processor 120, for example via an integrated memory controller hub. Additionally or alternatively, in some embodiments the memory 126 may be communicatively coupled to the MCP processor 120 via the I/O subsystem 124, which may be embodied as circuitry and/or components to facilitate input/output operations with the MCP processor 120, the memory 126, and other components of the computing device 100. For example, the I/O subsystem 124 may be embodied as, or otherwise include, memory controller hubs, input/output control hubs, sensor hubs, host controllers, firmware devices, communication links (i.e., point-to-point links, bus links, wires, cables, light guides, printed circuit board traces, etc.) and/or other components and subsystems to facilitate the input/output operations. Additionally, in some embodiments, the I/O subsystem 124 may form a portion of a system-on-a-chip (SoC) and be incorporated, along with the MCP processor 120, the memory 126, and other components of the computing device 100, on a single integrated circuit chip.

The data storage device 128 may be embodied as any type of device or devices configured for short-term or long-term storage of data such as, for example, memory devices and circuits, memory cards, hard disk drives, solid-state drives, non-volatile flash memory, or other data storage devices. The computing device 100 may also include a communications subsystem 130, which may be embodied as any communication circuit, device, or collection thereof, capable of enabling communications between the computing device 100 and other remote devices over a computer network (not shown). The communications subsystem 130 may be configured to use any one or more communication technology (e.g., wired or wireless communications) and associated protocols (e.g., Intel® Omni-Path Architecture, Ethernet, Infiniband®, Bluetooth®, Wi-Fi®, WiMAX, 3G, 4G LTE, 5G, etc.) to effect such communication.

As shown, the computing device 100 further includes a baseboard management controller (BMC) 132, which may be embodied as any hardware component(s) or circuitry capable of providing manageability and security-related services to the computing device 100. In particular, the BMC 132 may include a microprocessor, microcontroller, management controller, service processor, or other embedded controller capable of executing firmware and/or other code independently and securely from the MCP processor 120. For example, the BMC 132 may be embodied as a manageability engine (ME), a converged security and manageability engine (CSME), an Intel® innovation engine (IE), a board management controller (BMC), an embedded controller (EC), or other independent management controller of the computing device 100. The BMC 132 may communicate with the MCP processor 120 and/or other components of the computing device 100 over an I/O link such as PCI Express or over a dedicated bus, such as a platform environment control interface (PECI), host embedded controller interface (HECI), or other interface. The BMC 132 may also be capable of communicating using the communication subsystem 130 or a dedicated communication circuit independently of the state of the computing device 100 (e.g., independently of the state of the MCP processor 120), also known as "out-of-band" communication. The BMC 132 may execute a method for testing junction temperatures and controlling liquid cooling flow rates as described further below in connection with FIG. 7.

As shown, the computing device 100 may further include one or more peripheral devices 134. The peripheral devices 134 may include any number of additional input/output devices, interface devices, and/or other peripheral devices. For example, in some embodiments, the peripheral devices 134 may include a display, camera, touch screen, graphics circuitry, keyboard, mouse, speaker system, microphone, network interface, and/or other input/output devices, interface devices, and/or peripheral devices.

Figure 9:
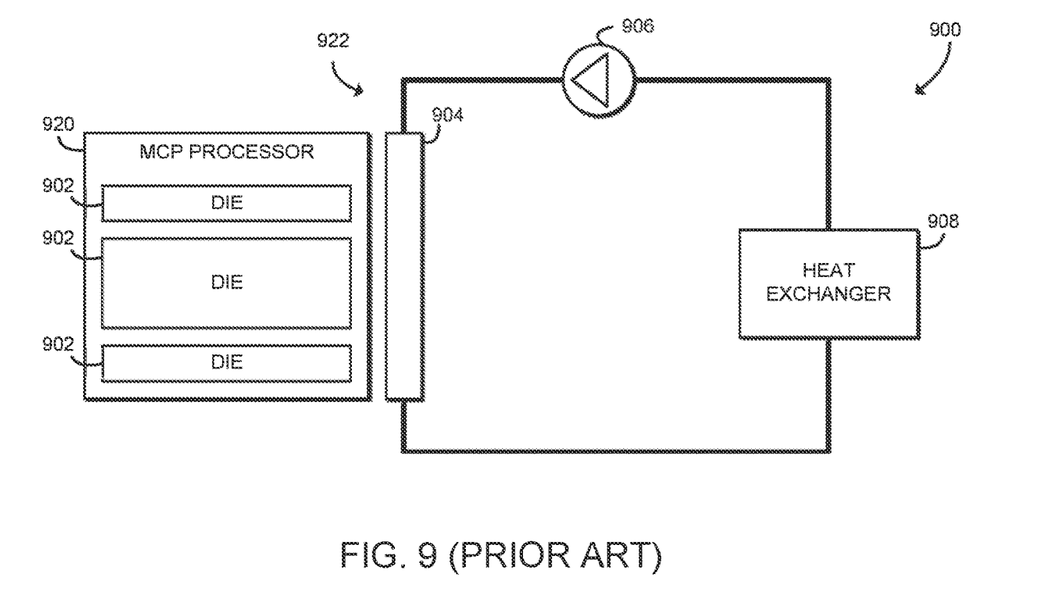
FIG. 9 is a simplified block diagram of a prior art cooling subsystem.

Referring now to FIG. 9, diagram 900 illustrates a prior art MCP processor 920 and prior art cooling subsystem 922. As shown, the MCP processor 120 includes multiple silicon dies 902. The prior art cooling subsystem 922 is a liquid cooling system including a cold plate 904 coupled to a fluid pump 906 and a heat exchanger 908. Generally, the pump 906 provides cooling fluid (e.g., water) to a fluid inlet of the cold plate 904. The fluid passes through the cold plate 904, which is positioned adjacent to the MCP processor 920. The fluid absorbs heat generated by the dies 902 of the MCP processor 920 and exits the cold plate 904 through a fluid outlet. The heated fluid flows to the heat exchanger 908, where excess heat is removed from the fluid.

Figure 2:
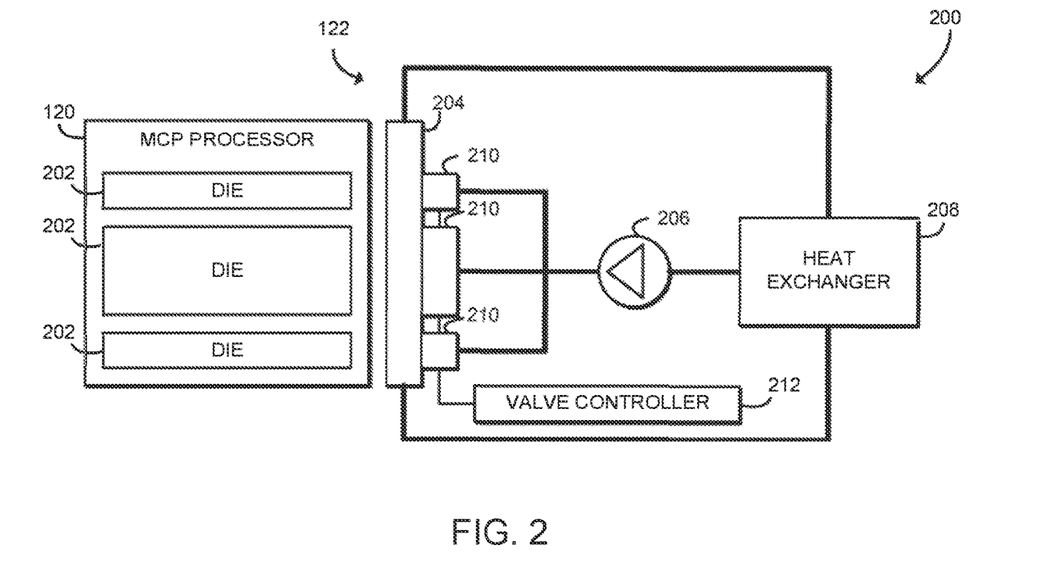
FIG. 2 is a simplified block diagram of at least one embodiment of a cooling subsystem of the computing device of FIG. 1.

Referring now to FIG. 2, diagram 200 illustrates the MCP processor 120 and the cooling subsystem 122 of the present disclosure. As shown, the MCP processor 120 includes multiple silicon dies 202. Each die 202 is an independent computer chip and may be produced using a different silicon process (e.g., 22 nm, 14 nm, 10 nm, or other silicon process size). The dies 202 may include various combinations of processor cores, processor graphics or graphics processing units (GPUs), field-programmable gate arrays (FPGAs), host fabric interfaces or host fabric adapters, network controllers, multi-channel dynamic random access memory (MCDRAM) stacks, high-bandwidth memory (HBM) stacks, platform controller hubs (PCHs), I/O adapters (e.g., Gen-4 PCIe adapters), or other types of dies. Each of the dies 202 may have different thermal properties (e.g., different thermal resistance) and may have a different optimal temperature.

Figure 4:
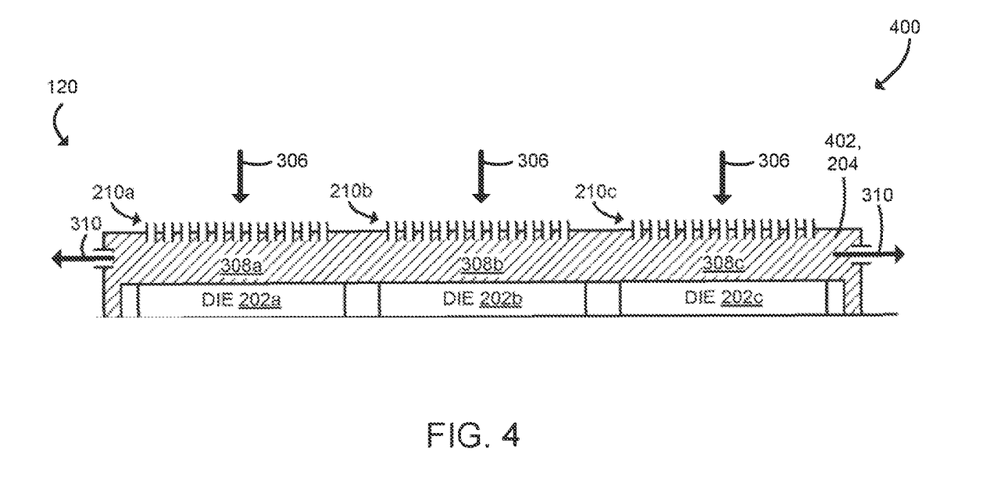
FIG. 4 is a schematic diagram of at least one embodiment of a micro-channel integrated heat spreader of the computing device of FIGS. 1-2.
Figure 5:
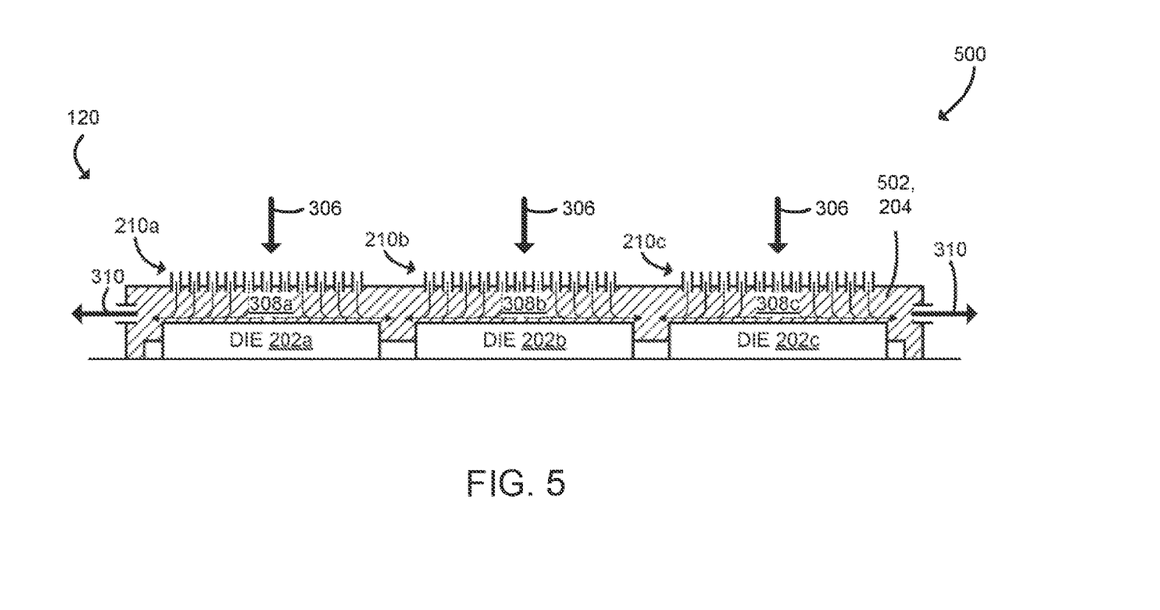
FIG. 5 is a schematic diagram of at least one embodiment of a direct impingement integrated heat spreader of the computing device of FIGS. 1-2.

As shown in FIG. 2, the illustrative cooling subsystem 122 is a liquid cooling system including a cold plate 204 coupled to a fluid pump 206 and a heat exchanger 208. Generally, the pump 206 provides cooling fluid (e.g., water) to a fluid inlet of the cold plate 204. The fluid passes through micro-channels or other fluid passages of the cold plate 204, which is positioned adjacent to the MCP processor 120. The fluid absorbs heat generated by the dies 202 of the MCP processor 120 and exits the cold plate 204 through a fluid outlet. The heated fluid flows to the heat exchanger 208, where excess heat is removed from the fluid. Although illustrated as a separate cold plate 204, it should be understood that in some embodiments the functions of the cold plate 204 may be incorporated into the MCP processor 120, for example into an integrated heat spreader of the MCP processor 120 as shown in FIGS. 4-5 and as discussed further below.

The cooling subsystem 122 further includes multiple banks of micro nozzle valves 210. In some embodiments, the cooling subsystem 122 may include nano nozzle valves. Each micro nozzle valve 210 is configured to control flow of the cooling fluid into the cold plate 204, for example by opening or closing. In use, each micro nozzle valve 210 may direct a jet of impinging fluid flow toward a particular die 202 of the MCP processor 120. Each bank of multiple micro nozzle valves 210 may be directed at or otherwise associated with a particular die 202 of the MCP processor 120. The cooling subsystem 122 includes a valve controller 212, which may be embodied as a microcontroller, digital signal processor, or other processor or processing/controlling circuit. The valve controller 212 may individually control (e.g., open, close, partially open, or otherwise control) the micro nozzle valves 210 according to input received from the MCP processor 120, the BMC 132, or other components of the computing device 100. The micro nozzle valves 210 and/or the valve controller 212 may be embodied as commercially available nozzles and controllers, for example as nozzles used in inkjet printing or other microfluidic applications.

Figure 3:
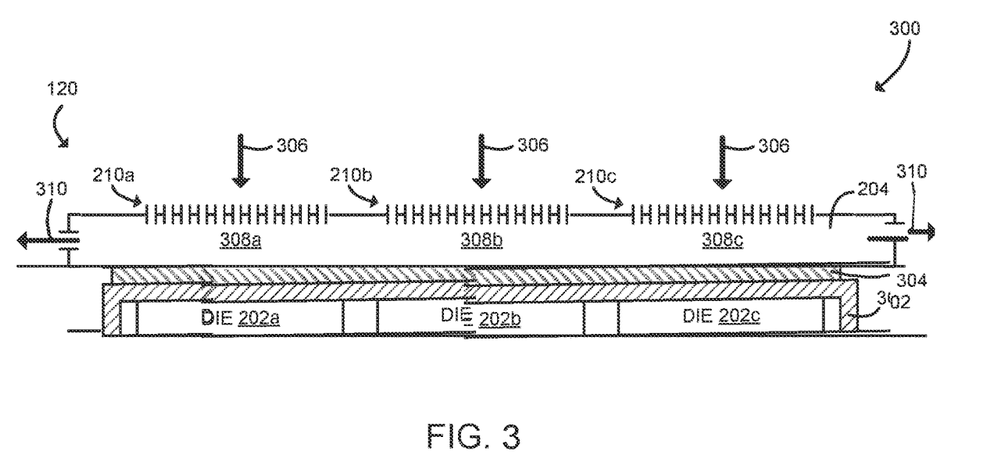
FIG. 3 is a schematic diagram of at least one embodiment of an integrated heat spreader and cold plate of the computing device of FIGS. 1-2.

Referring now to FIG. 3, diagram 300 illustrates one potential embodiment of the MCP processor 120. As shown, the illustrative MCP 120 includes three dies 202a, 202b, 202c. The illustrative MCP 120 includes an integrated heat spreader (IHS) 302 in physical contact with the dies 202a, 202b, 202c. The IHS 302 is covered with thermal interface material (TIM) 304, which is illustratively thermal grease (e.g., TIM2). The cold plate 204 is in physical contact with the TIM 304.

Cooling fluid enters the cold plate 204 through a fluid inlet 306. The cold plate 204 includes multiple groups of micro nozzle valves 210 that are positioned adjacent to each of the dies 202. As shown, micro nozzle valves 210a are positioned adjacent to the die 202a, micro nozzle valves 210b are positioned adjacent to the die 202b, and micro nozzle valves 210c are positioned adjacent to the die 202c. Fluid entering the cold plate 204 through the micro nozzle valves 210a, 210b, 210c passes through a respective fluid passage zone 308a, 308b, 308c. Each of the fluid passage zones 308a, 308b, 308c may include multiple micro channels or other fluid passages that are in proximity to the respective die 202a, 202b, 202c, allowing the fluid to absorb heat from the respective die 202a, 202b, 202c. After flowing through the fluid passage zones 308a, 308b, 308c, the heated fluid exits the cold plate 204 through a fluid outlet 310.

Referring now to FIG. 4, diagram 400 illustrates another potential embodiment of the MCP processor 120. Similar to FIG. 3, the illustrative MCP 120 includes three dies 202a, 202b, 202c. Unlike FIG. 3, the illustrative MCP 120 shown in FIG. 4 includes a micro-channel integrated heat spreader (IHS) 402 in physical contact with the dies 202a, 202b, 202c. The micro-channel IHS 402 integrates functionality of the cold plate 204. Thus, as shown, the MCP processor 120 does not include a layer of thermal interface material (TIM).

Similar to FIG. 3, cooling fluid enters the micro-channel IHS 402 through the fluid inlet 306. The micro-channel IHS 402 includes multiple groups of micro nozzle valves 210a, 210b, 210c that are positioned adjacent to each of the dies 202a, 202b, 202c. Fluid entering the micro-channel IHS 402 through the micro nozzle valves 210a, 210b, 210c passes through the respective fluid passage zone 308a, 308b, 308c. Each of the fluid passage zones 308a, 308b, 308c may include multiple micro channels or other fluid passages that are in proximity to the respective die 202a, 202b, 202c, allowing the fluid to absorb heat from the respective die 202a, 202b, 202c. After flowing through the fluid passage zones 308a, 308b, 308c, the heated fluid exits the micro-channel IHS 402 through the fluid outlet 310.

Referring now to FIG. 5, diagram 500 illustrates another potential embodiment of the MCP processor 120. Similar to FIGS. 3 and 4, the illustrative MCP 120 includes three dies 202a, 202b, 202c. The illustrative MCP 120 shown in FIG. 5 includes a micro-channel, direct impingement integrated heat spreader (IHS) 502 that integrates functionality of the cold plate 204. Thus, as shown, the MCP processor 120 does not include a layer of thermal interface material (TIM).

Cooling fluid enters the direct impingement IHS 502 through the fluid inlet 306. The direct impingement IHS 502 includes multiple groups of micro nozzle valves 210a, 210b, 210c that are positioned adjacent to each of the dies 202a, 202b, 202c. Fluid entering the micro-channel IHS 502 through the micro nozzle valves 210a, 210b, 210c passes through the respective fluid passage zone 308a, 308b, 308c and directly impinges on (i.e., strikes or otherwise contacts) the surface of the respective die 202a, 202b, 202c. Thus, the fluid absorbs heat from the dies 202a, 202b, 202c. The heated fluid is recovered from and exits the direct impingement IHS 502 through the fluid outlet ports 310.

Figure 6:
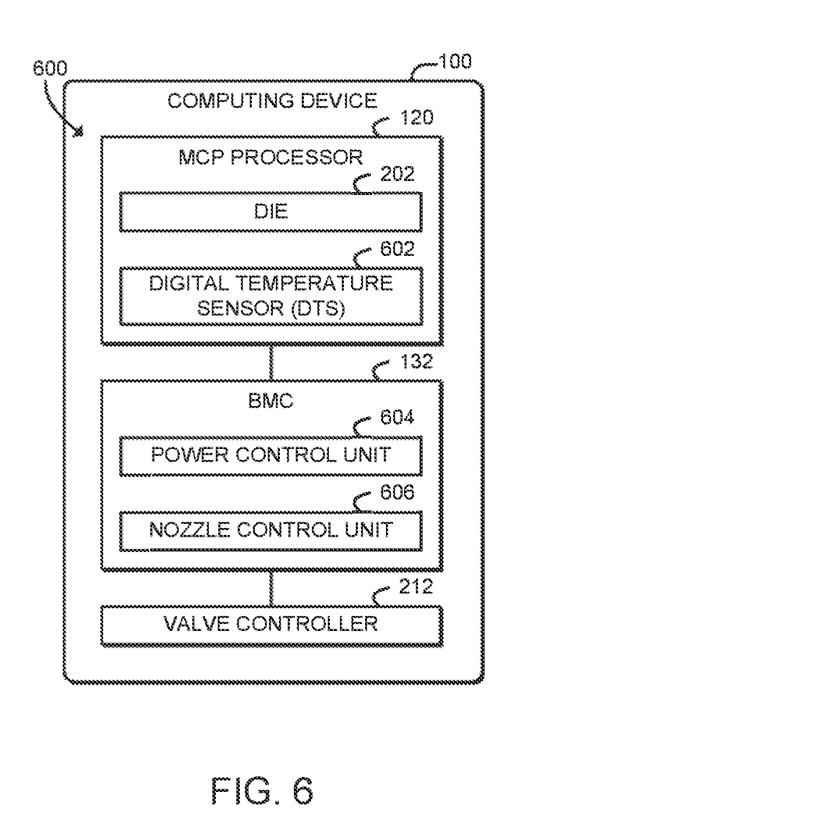
FIG. 6 is a simplified block diagram of at least one embodiment of an environment of the computing device of FIGS. 1-5.

Referring now to FIG. 6, in an illustrative embodiment, the computing device 100 establishes an environment 600 during operation. The illustrative environment 600 includes a digital temperature sensor (DTS) 602, a power control unit 604, and a nozzle control unit 606. The various components of the environment 600 may be embodied as hardware, firmware, software, or a combination thereof. As such, in some embodiments, one or more of the components of the environment 600 may be embodied as circuitry or collection of electrical devices (e.g., DTS circuitry 602, power control circuitry 604, and/or nozzle control circuitry 606). It should be appreciated that, in such embodiments, one or more of the DTS circuitry 602, the power control circuitry 604, and/or the nozzle control circuitry 606 may form a portion of the MCP processor 120, the I/O subsystem 124, the BMC 132, the valve controller 212, and/or other components of the computing device 100. Additionally, in some embodiments, one or more of the illustrative components may form a portion of another component and/or one or more of the illustrative components may be independent of one another.

The power control unit 604 is configured to read a predetermined die junction temperature for each die 202 of the MCP 120. The predetermined die junction temperature may be an optimal die junction temperature at which the corresponding die 202 has a minimum power dissipation. The predetermined die junction temperature may be read from one or more fuses of the computing device 100. The power control unit 604 is further configured to determine a current die junction temperature of each die 202, for example by reading the corresponding DTS 602. The power control unit 604 is further configured to compare the current die junction temperature to the predetermined die junction temperature for each die 202 and to determine a fluid flow rate for each die 202 based on that comparison. If the current die junction temperature is less than the predetermined die junction temperature, the fluid flow rate may be decreased, and if the current die junction temperature is not less than the predetermined die junction temperature, the fluid flow rate may be increased.

The nozzle control unit 606 is configured to control one or more micro nozzle valves 210 based on the fluid flow rate determined for each die 202. The nozzle control unit 606 may send activation signals or otherwise communicate with the valve controller 212 to control the micro nozzle vales 210.

Figure 7:
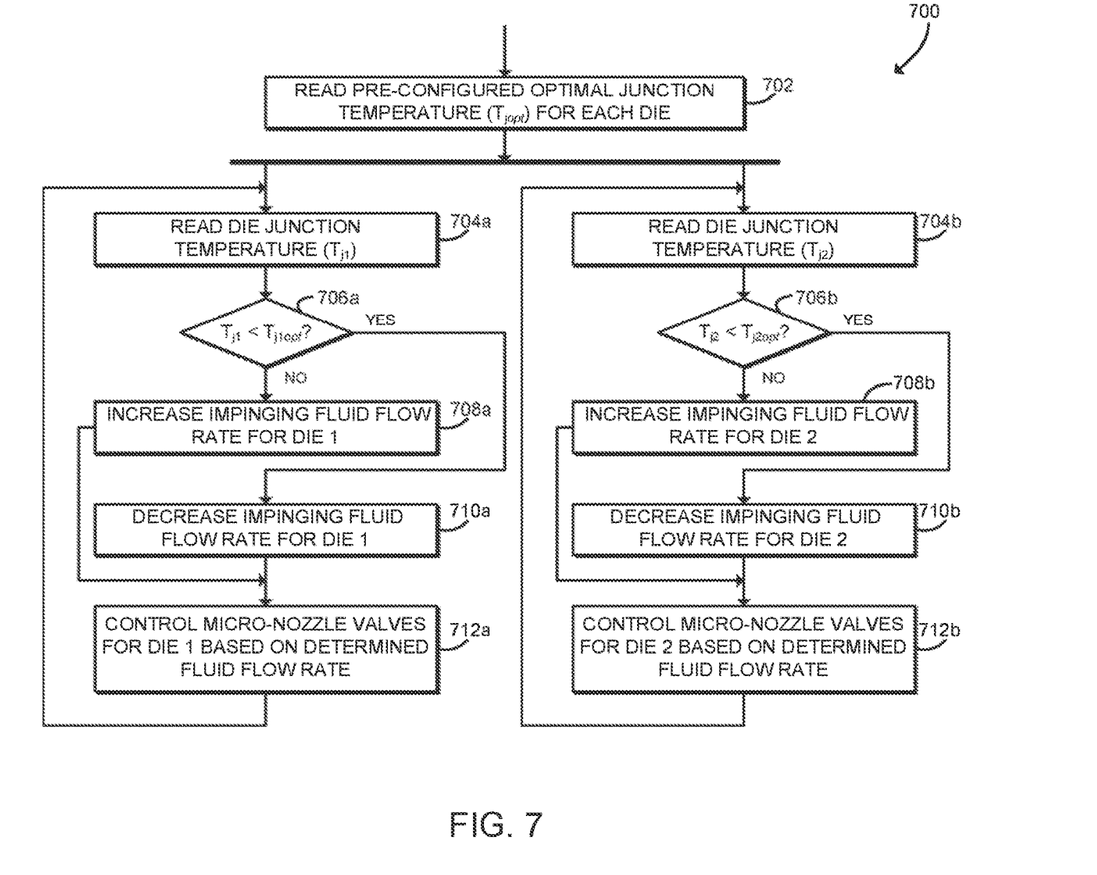
FIG. 7 is a simplified flow diagram of at least one embodiment of a method for dynamic cooling in a multi-chip package that may be executed by the computing device of FIGS. 1-6.

Referring now to FIG. 7, in use, the computing device 100 may execute a method 700 for dynamic cooling in a multi-chip package. It should be appreciated that, in some embodiments, the operations of the method 700 may be performed by one or more components of the environment 600 of the computing device 100 as shown in FIG. 6. In particular, in some embodiments the operations of the method 700 may be performed by software, firmware, and/or hardware of the BMC 132. The method 700 begins in block 702, in which the BMC 132 reads a pre-configured optimal junction temperature ($T_{jopt}$) for each die 202 of the MCP processor 120. As described above, the optimal temperature $T_{jopt}$ is a temperature at which the particular die 202 operates with minimum power dissipation, with maximum efficiency, or otherwise with optimal operational characteristics. The optimal temperature $T_{jopt}$ for each die 202 may be stored in read-only memory or otherwise pre-configured in the MCP processor 120, the I/O subsystem 122, or other components of the computing device 100. For example, in some embodiments the BMC 132 may read the optimal temperature $T_{jopt}$ for each die 202 from a bank of fuses or other read-only feature of the MCP processor 120.

After reading the pre-configured optimal temperature $T_{jopt}$, the method 700 proceeds in parallel to multiple instances of the block 704. In particular, the method 700 may execute one block 704 for each die $202_i$ of the MCP processor 120. In the illustrative embodiment of FIG. 7, the method 700 proceeds to execute blocks 704a, 704b in parallel. Thus, in the illustrative embodiment, the MCP 120 may have two dies $202_1$, $202_2$. It should be understood that in other embodiments, the method 700 may execute a different number of instances of the block 704 in parallel. Additionally or alternatively, in some embodiments the operations of the method 700 may be performed sequentially for each die 202 of the MCP 120.

In blocks 704a, 704b, the BMC 132 reads the current die junction temperature $T_{ji}$ for the die $202_i$. For example, in the block 704a the BMC 132 reads the temperature $T_{j1}$ for die $202_1$, and in the block 704b the BMC 132 reads the temperature $T_{j2}$ for die $202_2$. The BMC 132 may read the temperature $T_{ji}$ from a DTS 602 or other temperature sensor that is included in or otherwise coupled to the respective die $202_i$.

In blocks 706a, 706b, the BMC 132 compares the current temperature $T_{ji}$ to the optimal temperature $T_{jiopt}$ for the respective die $202_i$. For example, in the block 706a the BMC 132 compares the temperatures $T_{j1}$ and $T_{j1opt}$, and in the block 706b the BMC 132 compares the temperatures $T_{j2}$ and $T_{j2opt}$. Illustratively, to compare the temperatures, the BMC 132 determines whether the temperature $T_{ji}$ is less than the optimal temperature $T_{jiopt}$; in other embodiments, the BMC 132 may determine whether the temperature $T_{ji}$ has another predetermined relationship to the optimal temperature $T_{jiopt}$ (e.g., less than or equal to, greater than, etc.). If the temperature $T_{Ji}$ is less than the optimal temperature $T_{jiopt}$ the method 700 branches ahead to blocks 710a, 710b, described below. If the temperature $T_{ji}$ is not less than the optimal temperature $T_{jiopt}$, the method 700 branches to blocks 708a, 708b.

In blocks 708a, 708b, the BMC 132 increases an impinging fluid flow rate for the corresponding die $202_i$. Increasing the impinging fluid flow rate increases the rate of heat removal from the die $202_i$. Thus, increasing impinging fluid flow rate tends to decrease temperature of the die $202_i$ toward the optimal temperature $T_{jiopt}$. After increasing the impinging fluid flow rate, the method 700 advances to blocks 712a, 712b, described below.

Referring back to blocks 706a, 706b, if the temperature $T_{Ji}$ is less than the optimal temperature $T_{jiopt}$ the method 700 branches to blocks 710a, 710b, in which the BMC 132 decreases the impinging fluid flow rate for the corresponding die $202_i$. Decreasing the impinging fluid flow rate decreases the rate of heat removal from the die $202_i$. Thus, decreasing the impinging fluid flow rate may allow temperature of the die $202_i$ to increase toward the optimal temperature $T_{jiopt}$. After decreasing the impinging fluid flow rate, the method 700 advances to blocks 712a, 712b.

In blocks 712a, 712b the BMC 132 controls the micro nozzle valves $210_i$ for the respective die $202_i$ based on the determined fluid flow rate. For example, to increase the fluid flow rate, the BMC 132 may open additional micro nozzle valves $210_i$ and/or adjust the micro nozzle valves $210_i$ to increase fluid flow. Similarly, to decrease the fluid flow rate, the BMC 132 may close additional micro nozzle valves $210_i$ and/or adjust the micro nozzle valves $210_i$ to decrease fluid flow. The BMC 132 may assert one or more control signals or otherwise signal the valve controller 212 to control the micro nozzle valves 210. As shown in FIG. 7, the BMC 132 may control the nozzle valves $210_i$ independently for each die $202_i$. Thus, each die $202_i$ may be independently controlled to a respective optimal temperature $T_{jiopt}$. After controlling the micro nozzle valves 210, the method 700 loops back to blocks 704a, 704b to continue monitoring die temperature and controlling the micro nozzle valves 210.

It should be appreciated that, in some embodiments, the method 700 may be embodied as various instructions stored on a computer-readable media, which may be executed by the MCP processor 120, the I/O subsystem 124, the BMC 132, and/or other components of the computing device 100 to cause the computing device 100 to perform the respective method 700 respectively. The computer-readable media may be embodied as any type of media capable of being read by the computing device 100 including, but not limited to, the memory 126, the data storage device 128, firmware devices, other memory or data storage devices of the computing device 100, portable media readable by a peripheral device 134 of the computing device 100, and/or other media.

EXAMPLES

Illustrative examples of the technologies disclosed herein are provided below. An embodiment of the technologies may include any one or more, and any combination of, the examples described below.

Example 1 includes a computing device comprising: a multi-chip package comprising a plurality of dies; a cold plate coupled to the multi-chip package, wherein the cold plate comprises a plurality of fluid passage zones, wherein each fluid passage zone is positioned adjacent to a corresponding die of the plurality of dies; and a plurality of valves, wherein each valve is coupled to a fluid passage zone and is configured to control fluid flow into the fluid passage zone.

Example 2 includes the subject matter of Example 1, and further comprising: a power control unit to: read a predetermined die junction temperature for a first die of the plurality of dies; determine a current die junction temperature of the first die; compare the current die junction temperature to the predetermined die junction temperature; and determine a fluid flow rate based on comparing the current die junction temperature and the predetermined die junction temperature; and a nozzle control unit to control one or more valves of the plurality of valves based on the fluid flow rate, wherein the one or more valves are coupled to a fluid passage zone that is positioned adjacent to the first die.

Example 3 includes the subject matter of any of Examples 1 and 2, and wherein: to compare the current die junction temperature to the predetermined die junction temperature comprises to determine whether the current die junction temperature is less than the predetermined die junction temperature; and to determine the fluid flow rate based on comparing the current die junction temperature and the predetermined die junction temperature comprises to: increase the fluid flow rate in response to a determination that the current die junction temperature is not less than the corresponding predetermined die junction temperature; and decrease the fluid flow rate in response to a determination that the current die junction temperature is less than the corresponding predetermined die junction temperature.

Example 4 includes the subject matter of any of Examples 1-3, and wherein the predetermined die junction temperature comprises an optimal die junction temperature, wherein the first die has a minimum power dissipation at the optimal die junction temperature.

Example 5 includes the subject matter of any of Examples 1-4, and wherein to read the predetermined die junction temperature comprises to read one or more fuses of the computing device.

Example 6 includes the subject matter of any of Examples 1-5, and wherein to determine the current die junction temperature comprises to read a digital temperature sensor of the multi-chip package.

Example 7 includes the subject matter of any of Examples 1-6, and wherein the plurality of dies comprises a processor core, a graphics processing unit, a field-programmable gate array, a host fabric interface, a multi-channel memory die, or a high-bandwidth memory die.

Example 8 includes the subject matter of any of Examples 1-7, and wherein the computing device comprises a manageability controller, wherein the manageability controller comprises the power control unit and the nozzle control unit.

Example 9 includes the subject matter of any of Examples 1-8, and wherein the multi-chip package comprises a processor separate from the manageability controller.

Example 10 includes the subject matter of any of Examples 1-9, and wherein the manageability controller comprises a baseboard management controller.

Example 11 includes the subject matter of any of Examples 1-10, and wherein the multi-chip package comprises an integrated heat spreader coupled to the cold plate.

Example 12 includes the subject matter of any of Examples 1-11, and wherein the multi-chip package comprises an integrated heat spreader that includes the cold plate, wherein the integrated heat spreader comprises the fluid passage zone.

Example 13 includes the subject matter of any of Examples 1-12, and wherein the integrated heat spread comprises a direct impingement integrated heat spreader wherein the fluid passage zone adjacent to the each die directly impinges on the corresponding die.

Example 14 includes a method comprising: reading, by a computing device, a predetermined die junction temperature for a first die of a plurality of dies of a multi-chip package of the computing device; determining, by the computing device, a current die junction temperature of the first die; comparing, by the computing device, the current die junction temperature to the predetermined die junction temperature; determining, by the computing device, a fluid flow rate based on comparing the current die junction temperature and the predetermined die junction temperature; and controlling, by the computing device, one or more valves based on the fluid flow rate, wherein the one or more valves are coupled to a fluid passage zone of a cold plate, wherein the fluid passage zone is positioned adjacent to the first die, and wherein the one or more valves are configured to control fluid flow into the fluid passage zone.

Example 15 includes the subject matter of Example 14, and wherein: comparing the current die junction temperature to the predetermined die junction temperature comprises determining whether the current die junction temperature is less than the predetermined die junction temperature; and determining the fluid flow rate based on comparing the current die junction temperature and the predetermined die junction temperature comprises: increasing the fluid flow rate in response to determining that the current die junction temperature is not less than the corresponding predetermined die junction temperature; and decreasing the fluid flow rate in response to determining that the current die junction temperature is less than the corresponding predetermined die junction temperature.

Example 16 includes the subject matter of any of Examples 14 and 15, and wherein the predetermined die junction temperature comprises an optimal die junction temperature, wherein the first die has a minimum power dissipation at the optimal die junction temperature.

Example 17 includes the subject matter of any of Examples 14-16, and wherein reading the predetermined die junction temperature comprises reading one or more fuses of the computing device.

Example 18 includes the subject matter of any of Examples 14-17, and wherein determining the current die junction temperature comprises reading digital temperature sensor of the multi-chip package.

Example 19 includes the subject matter of any of Examples 14-18, and wherein the plurality of dies comprises a processor core, a graphics processing unit, a field-programmable gate array, a host fabric interface, a multi-channel memory die, or a high-bandwidth memory die.

Example 20 includes the subject matter of any of Examples 14-19, and wherein the computing device comprises a manageability controller, wherein the manageability controller comprises the power control unit and the nozzle control unit.

Example 21 includes the subject matter of any of Examples 14-20, and wherein the multi-chip package comprises a processor separate from the manageability controller.

Example 22 includes the subject matter of any of Examples 14-21, and wherein the manageability controller comprises a baseboard management controller.

Example 23 includes the subject matter of any of Examples 14-22, and wherein the multi-chip package comprises an integrated heat spreader coupled to the cold plate.

Example 24 includes the subject matter of any of Examples 14-23, and wherein the multi-chip package comprises an integrated heat spreader that includes the cold plate, wherein the integrated heat spreader comprises the fluid passage zone.

Example 25 includes the subject matter of any of Examples 14-24, and wherein the integrated heat spread comprises a direct impingement integrated heat spreader wherein the fluid passage zone adjacent to the each die directly impinges on the corresponding die.

Example 26 includes a computing device comprising: a processor; and a memory having stored therein a plurality of instructions that when executed by the processor cause the computing device to perform the method of any of Examples 14-25.

Example 27 includes one or more machine readable storage media comprising a plurality of instructions stored thereon that in response to being executed result in a computing device performing the method of any of Examples 14-25.

Example 28 includes a computing device comprising means for performing the method of any of Examples 14-25.

The invention claimed is:

1. A computing device comprising:
a package including a first die and a second die adjacent to the first die in a side-by-side arrangement;
a first plurality of nozzle valves aligned with the first die to direct a cooling fluid towards the first die, different ones of the first plurality of nozzle valves to be selectively opened or closed independent of other ones of the first plurality of nozzle valves;
a second plurality of nozzle valves aligned with the second die to direct the cooling fluid towards the second die, the second plurality of nozzle valves to be controlled independent of the first plurality of nozzle valves; and
one or more outlets, the cooling fluid to exit through the one or more outlets.

2. The computing device of claim 1, further including:
a cold plate coupled to the package.

3. The computing device of claim 2, wherein there is no layer of thermal interface material between the cold plate and the first and second dies.

4. The computing device of claim 2, wherein the cold plate has a first surface and a second surface opposite the first surface, the first surface to face away from the first and second dies when the cold plate is coupled to the package, both the first plurality of nozzle valves and the second plurality of nozzle valves distributed along the first surface of the cold plate.

5. The computing device of claim 4, wherein the first die extends into the cold plate such that the first die is closer to the first plurality of nozzle valves than the second surface of the cold plate is to the first plurality of nozzle valves.

6. The computing device of claim 1, wherein the first die corresponds to at least one of a processor core, a graphics processing unit, a field-programmable gate array, a host fabric interface, a high bandwidth memory die, or a multi-channel memory die.

7. The computing device of claim 1, wherein the first plurality of nozzle valves provide the cooling fluid to fluid passages in proximity to at least a portion of the first die.

8. The computing device of claim 1, wherein ones of first plurality of nozzle valves are controllable based on a temperature of the first die.

9. The computing device of claim 8, wherein the temperature of the first die is a measured die junction temperature of the first die.

10. The computing device of claim 9, wherein a number of the first plurality of nozzle valves to be opened is determined based on a comparison of the measured die junction temperature to a reference die junction temperature associated with the first die.

11. The computing device of claim 10, wherein the measured die junction temperature is a first measured die junction temperature, and the reference die junction temperature is a first reference die junction temperature, the second plurality of nozzle valves controllable based on a comparison of a second die junction temperature of the second die to a second reference die junction temperature associated with the second die, the second reference die junction temperature different than the first reference die junction temperature.

12. The computing device of claim 9, wherein the measured die junction temperature is less than a maximum junction temperature set for the first die.

13. The computing device of claim 1, further including a plate to cover the first and second dies, the plate including lateral walls surrounding the first and second dies.

14. The computing device of claim 1, wherein the first plurality of nozzle valves is distributed across a first area, and the second plurality of nozzle valves is distributed across a second area, the second area larger than the first area.

15. The computing device of claim 1, wherein adjacent ones of the first plurality of nozzle valves are closer to one another than any valve in the first plurality of valves is to any valve in the second plurality of valves.

16. The computing device of claim 1, wherein the first plurality of nozzle valves includes micro nozzle valves.

17. The computing device of claim 1, wherein the first plurality of nozzle valves includes nano nozzle valves.

18. A method comprising:
providing a package including a first die and a second die adjacent to the first die in a side-by-side arrangement;
aligning first nozzle valves with the first die, the first nozzle valves to direct cooling fluid towards the first die, different ones of the nozzle valves to be selectively opened or closed independent of other ones of the first nozzle valves;
aligning second nozzle valves with the second die, the second nozzle valves to direct the cooling fluid towards the second die, the second nozzle valves to be controlled independent of the first nozzle valves; and providing one or more outlets, the cooling fluid to exit through the one or more outlets.

19. The method of claim 18, further including:

providing a cold plate coupled to the package.

20. The method of claim 18, wherein the first nozzle valves provide the cooling fluid to fluid passages in proximity to at least a portion of the first die.

21. The method of claim 18, wherein the first nozzle valves are controllable such that different ones of the first nozzle valves provide different amounts of the cooling fluid.

22. The method of claim 18, wherein the first nozzle valves are controllable based on a temperature of the first die.

23. The method of claim 18, further including:

measuring a first die junction temperature of the first die;

comparing the first die junction temperature to a reference die junction temperature, the reference die junction temperature specific to the first die; and adjusting an amount of the first nozzles valves that are opened based on the comparison.

24. A system comprising:

a fluid pump to provide fluid;

a package including a first die and a second die adjacent to the first die in a side-by-side arrangement;

a first bank of nozzle valves to be aligned with and to direct a cooling fluid towards the first die, different ones of the first bank of nozzle valves to be selectively opened or closed independent of other ones of the first bank of nozzle valves;

a second bank of nozzle valves to be aligned with and to direct the cooling fluid towards the second die, the second bank of nozzle valves to be controlled independent of the first bank of nozzle valves; and one or more outlets, the cooling fluid to exit through the one or more outlets.

25. The system of claim 24, further including:

a cold plate coupled to the package.

26. The system of claim 24, wherein the first die corresponds to at least one of a processor core, a graphics processing unit, a field-programmable gate array, a host fabric interface, a high bandwidth memory die, or a multi-channel memory die.

27. The system of claim 24, wherein the first bank of nozzle valves provide the cooling fluid to fluid passages in proximity to at least a portion of the first die.

* * * * *